United States Patent
Bradley

(10) Patent No.: US 9,964,585 B1
(45) Date of Patent: May 8, 2018

(54) EXACT PHASE SYNCHRONIZATION OF A REMOTE RECEIVER WITH A MEASUREMENT INSTRUMENT

(71) Applicant: ANRITSU COMPANY, Morgan Hill, CA (US)

(72) Inventor: Donald Anthony Bradley, Morgan Hill, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 0 days. days.

(21) Appl. No.: 15/351,261

(22) Filed: Nov. 14, 2016

Related U.S. Application Data

(60) Provisional application No. 62/255,284, filed on Nov. 13, 2015, provisional application No. 62/255,290, filed on Nov. 13, 2015.

(51) Int. Cl.
*G01R 27/02* (2006.01)
*G01R 31/28* (2006.01)
*G01R 25/00* (2006.01)

(52) U.S. Cl.
CPC ........... *G01R 31/282* (2013.01); *G01R 25/00* (2013.01)

(58) Field of Classification Search
CPC ............................ G01R 31/282; G01R 25/00
USPC .......................................................... 324/605
See application file for complete search history.

(56) References Cited

U.S. PATENT DOCUMENTS

| | | | | | |
|---|---|---|---|---|---|
| 4,551,856 A | * | 11/1985 | Victor | ................... | H03J 5/0281 455/165.1 |
| 4,661,995 A | | 4/1987 | Kashiwagi | | |
| 4,669,051 A | * | 5/1987 | Barr, IV | ................. | G01R 23/16 324/76.13 |
| 4,884,020 A | * | 11/1989 | Blakeslee | .............. | G01R 25/00 324/76.47 |
| 5,028,886 A | * | 7/1991 | Seibel | .................... | H03B 23/00 327/41 |
| 5,121,065 A | * | 6/1992 | Wagner | .................. | G01R 13/34 324/605 |
| 5,291,140 A | * | 3/1994 | Wagner | .................. | G01R 13/34 324/603 |

(Continued)

OTHER PUBLICATIONS

United States Patent and Trademark Office, Notice of Allowance dated Sep. 27, 2017 for U.S. Appl. No. 15/351,291, 13 Pages.

(Continued)

*Primary Examiner* — Jermele M Hollington
*Assistant Examiner* — Sean Curtis
(74) *Attorney, Agent, or Firm* — Tucker Ellis LLP

(57) ABSTRACT

A measurement instrument for measuring electrical characteristics of a device under test (DUT) includes a synchronization signal generator, a coarse phase detection counter and a fine phase detection counter. The synchronization signal generator is connectable with a receiver via a fiber optic cable and a duplexer configured to transmit a synchronization signal from the measurement instrument to the receiver and retransmit the received synchronization signal from the receiver to the measurement instrument. The coarse phase detection counter and the fine phase detection counter are configured to determine one or both of a distance from the receiver to the measurement instrument and a phase shift in the synchronization signal between the receiver and the measurement instrument.

9 Claims, 12 Drawing Sheets

(56) References Cited

U.S. PATENT DOCUMENTS

| | | | |
|---|---|---|---|
| 5,524,281 A * | 6/1996 | Bradley | G01R 27/28 324/601 |
| 5,642,039 A * | 6/1997 | Bradley | G01R 23/163 324/646 |
| 5,977,779 A * | 11/1999 | Bradley | G01R 27/28 324/638 |
| 6,020,733 A * | 2/2000 | Bradley | G01R 23/163 324/637 |
| 6,157,183 A | 12/2000 | Bradley | |
| 6,384,772 B1 * | 5/2002 | Bradley | G01S 7/4052 331/1 R |
| 6,417,703 B1 * | 7/2002 | Bradley | H03L 7/183 327/105 |
| 6,538,779 B1 | 3/2003 | Takeshita et al. | |
| 6,611,537 B1 * | 8/2003 | Edens | H04L 12/2803 348/E7.05 |
| 6,700,531 B2 | 3/2004 | Abou-Jaoude et al. | |
| 6,718,138 B1 | 4/2004 | Sugawara | |
| 6,928,373 B2 * | 8/2005 | Martens | G01R 35/005 324/601 |
| 7,058,377 B1 | 6/2006 | Mitsdarffer et al. | |
| 7,065,466 B2 | 6/2006 | Clarke et al. | |
| 7,170,297 B1 * | 1/2007 | Dunsmore | G01R 27/28 324/534 |
| 7,181,205 B1 | 2/2007 | Scott et al. | |
| 7,474,972 B2 | 1/2009 | Pickerd et al. | |
| 7,772,928 B2 * | 8/2010 | Ortler | H03L 7/23 331/11 |
| 7,791,028 B2 | 9/2010 | Baltz et al. | |
| 7,924,025 B2 | 4/2011 | Eisenstadt et al. | |
| 7,940,056 B2 | 5/2011 | Maslen | |
| 8,009,984 B2 | 8/2011 | Maeda et al. | |
| 8,514,919 B2 | 8/2013 | Estrada et al. | |
| 8,559,885 B2 | 10/2013 | Seelenfreund et al. | |
| 8,569,705 B2 | 10/2013 | Baltz et al. | |
| 8,760,148 B1 * | 6/2014 | Bradley | H04B 3/46 323/222 |
| 8,841,923 B1 * | 9/2014 | Vanwiggeren | G01R 19/0053 324/606 |
| 9,207,168 B2 | 12/2015 | Lovely et al. | |
| 9,244,121 B2 * | 1/2016 | Ng | G01R 31/311 |
| 9,291,657 B2 * | 3/2016 | Zaostrovnykh | G01R 27/28 |
| 9,366,707 B1 * | 6/2016 | Bradley | G01R 27/32 |
| 9,733,289 B1 * | 8/2017 | Bradley | G01R 27/06 |
| 9,810,726 B2 * | 11/2017 | Nielsen | G01R 25/00 |
| 9,860,054 B1 * | 1/2018 | Bradley | H04L 7/0075 |
| 2001/0038674 A1 * | 11/2001 | Trans | H04B 1/00 375/355 |
| 2003/0043768 A1 | 3/2003 | Chang et al. | |
| 2004/0021864 A1 | 2/2004 | McAlexander et al. | |
| 2004/0066182 A1 | 4/2004 | Evers et al. | |
| 2004/0218930 A1 * | 11/2004 | Dorrer | G01J 11/00 398/188 |
| 2005/0002675 A1 | 1/2005 | Sardesai et al. | |
| 2005/0089326 A1 | 4/2005 | Regev et al. | |
| 2005/0141603 A1 | 6/2005 | Miller | |
| 2006/0261282 A1 * | 11/2006 | Nakajima | H04N 5/0733 250/370.14 |
| 2007/0098402 A1 * | 5/2007 | Maeda | H04B 10/66 398/38 |
| 2007/0114443 A1 | 5/2007 | Baltz et al. | |
| 2008/0094072 A1 | 4/2008 | Noujeim | |
| 2009/0096536 A1 | 4/2009 | Ortler | |
| 2010/0141305 A1 * | 6/2010 | Ortler | G01R 27/28 327/117 |
| 2010/0277159 A1 | 11/2010 | Ng et al. | |
| 2010/0321702 A1 | 12/2010 | Froggatt et al. | |
| 2011/0291706 A1 | 12/2011 | Bradley | |
| 2012/0008714 A1 | 1/2012 | Rizwan | |
| 2012/0020397 A1 | 1/2012 | Estrada et al. | |
| 2012/0128369 A1 * | 5/2012 | Hann | H03L 7/07 398/138 |
| 2013/0188176 A1 | 7/2013 | Lovely et al. | |
| 2013/0188177 A1 | 7/2013 | Lovely et al. | |
| 2013/0223499 A1 | 8/2013 | Dark | |
| 2014/0286382 A1 | 9/2014 | Dark | |
| 2014/0292363 A1 | 10/2014 | Ng et al. | |
| 2015/0115175 A1 | 4/2015 | Baltz et al. | |
| 2016/0033563 A1 | 2/2016 | Needham et al. | |
| 2016/0109513 A1 * | 4/2016 | Vickers | G01R 31/311 324/754.23 |
| 2016/0139200 A1 | 5/2016 | Ng et al. | |
| 2017/0067949 A1 * | 3/2017 | Nielsen | G01R 25/00 |
| 2017/0184646 A1 | 6/2017 | Needham et al. | |

OTHER PUBLICATIONS

Lipinski, Maciej,."White Rabbit: Ethernet-based solution for sub-ns synchronization and deterministic, reliable data delivery", IEEE Plenary Meeting Geneva, Jul. 15, 2013, 124 pages.

* cited by examiner $F_{LO} > F_{RF}$

① $F_{IF} = F_{LO} - F_{RF}$ $F_{LO} = N \cdot F_{SYNC}$ $F_{SYNC} = F_{IF}$

② $F_{LO} = N \cdot F_{IF}$ $N = 1 + F_{RF} / F_{IF}$

TARGET $F_{IF} \approx 10$ MHz $N_P = INT(1 + F_{RF} / F_{IF}) = INT(1 + F_{RF} / 10)$ $F_{IF} = F_{RF} / (N_P - 1)$ $F_{LO} = F_{RF} + F_{IF}$

EXACT PHASE SYNCHRONIZATION OF A REMOTE RECEIVER WITH A MEASUREMENT INSTRUMENT

CLAIM OF PRIORITY

This application claims the benefit of priority to U.S. Provisional Application titled "SYNCHRONIZATION OF A REMOTE WIDE BAND RECEIVER USING A NARROW BAND LOW FREQUENCY SIGNAL OVER A FIBER OPTIC CABLE", Application No. 62/255,290, filed Nov. 13, 2015 and U.S. Provisional Application titled "EXACT PHASE SYNCHRONIZATION OF A REMOTE RECEIVER OVER A SINGLE DUPLEXED FIBER OPTIC CABLE", Application No. 62/255,284, filed Nov. 13, 2015, which applications are herein incorporated by reference.

TECHNICAL FIELD

The present invention relates generally to methods of measuring an electrical response of a device under test (DUT) and instruments that measure an electrical response of a DUT to test signals.

BACKGROUND

Measuring an electrical response to test signals of a device under test (DUT), such as a component or components of a telecommunication (telecom) network, can provide information about how the component or components of the DUT affect signals transmitted through the DUT. A DUT can affect both the amplitude and the phase of a signal. Power measurements can communicate how a DUT attenuates different frequency components of a signal. Phase measurements can communicate how a DUT affects the phase of different frequency components of a signal. For example, a phase measurement of the response of a DUT to a test signal can determine the group delay for each of the frequency components of the test signal, and can be used to determine how linear the response of the DUT is to the test signal. Phase measurements can also help track the path of a test signal or determine causality, e.g. locating a source of passive intermodulation (PIM) within a DUT.

Phase measurements using a transmitter and a receiver separate from each other requires the transmitter and the receiver to be synchronized, for example using a synchronization signal transmitted from the transmitter to the receiver. However, if the distance of a transmission path through the DUT requires the transmitter and the receiver to be separated by a large distance, phase information about the DUT can be difficult to obtain using a synchronization signal transmitted between the transmitter and the receiver based on methods and instruments in accordance with the prior art because a large signal path introduces phase to the synchronization signal and attenuates the synchronization signal. Embodiments of the present invention are intended to address this difficulty.

SUMMARY

In accordance with an embodiment, a measurement instrument for measuring electrical characteristics of a device under test (DUT) includes a synchronization signal generator, a coarse phase detection counter and a fine phase detection counter. The synchronization signal generator is connectable with a receiver via a fiber optic cable and a duplexer configured to transmit a synchronization signal from the measurement instrument to the receiver and retransmit the received synchronization signal from the receiver to the measurement instrument.

In accordance with an embodiment, the coarse phase detection counter includes a runt generator for inserting a runt pulse into the synchronization signal and a runt detector for counting a number of cycles of the synchronization signal transmitted from the measurement instrument until the runt pulse is detected in the retransmitted synchronization signal received at the measurement instrument. The fine phase detection counter including a phase-to-voltage converter for determining a fraction of a period of the retransmitted synchronization signal received at the measurement instrument. The coarse phase detection counter and the fine phase detection counter are configured to determine one or both of a distance from the receiver to the measurement instrument and a phase shift in the synchronization signal between the receiver and the measurement instrument.

In accordance with an embodiment, a system for measuring electrical characteristics of a device under test (DUT) includes a measurement instrument adapted to be connected with the DUT for transmitting tests signals to the DUT and a receiver adapted to be connected with the DUT and arranged remote from the measurement instrument to receive the test signals transmitted by the measurement instrument to the DUT. The measurement instrument includes a synchronization signal generator, a coarse phase detection counter and a fine phase detection counter. A duplexer is configured to transmit a synchronization signal from the measurement instrument to the receiver via fiber optic cable and retransmit the received synchronization signal from the receiver to the measurement instrument.

In accordance with an embodiment, the coarse phase detection counter and the fine phase detection counter are usable for determine one or both of a distance from the receiver to the measurement instrument and a phase shift in the synchronization signal between the receiver and the measurement instrument. The coarse phase detection counter includes a runt generator for inserting a runt pulse into the synchronization signal and a runt detector for counting a number of cycles of the synchronization signal transmitted from the measurement instrument until the runt pulse is detected in the retransmitted synchronization signal received at the measurement instrument. The fine phase detection counter includes a phase-to-voltage converter for determining a fraction of a period of the retransmitted synchronization signal received at the measurement instrument.

In accordance with an embodiment, a method for measuring electrical characteristics of a device under test (DUT) based on transmitted test signals includes using a measurement instrument comprising a synchronization signal generator, a coarse phase detection counter and a fine phase detection counter. A test port of the measurement instrument is connected to the DUT. A test port of a receiver is also connected to the DUT such that the receiver receives test signals transmitted by the measurement installment and through the DUT. A synchronization port of the measurement instrument is connected to a synchronization port of the receiver via a fiber optic cable and a duplexer such that the receiver receives the synchronization signal. The coarse phase detection counter and the fine phase detection counter determine one or both of a distance from the receiver to the measurement instrument and a phase shift in the synchronization signal between the receiver and the measurement instrument. Once the distance or phase is determined, electrical characteristics of the DUT based on the transmitted test signals can be measured.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

Figure 1:
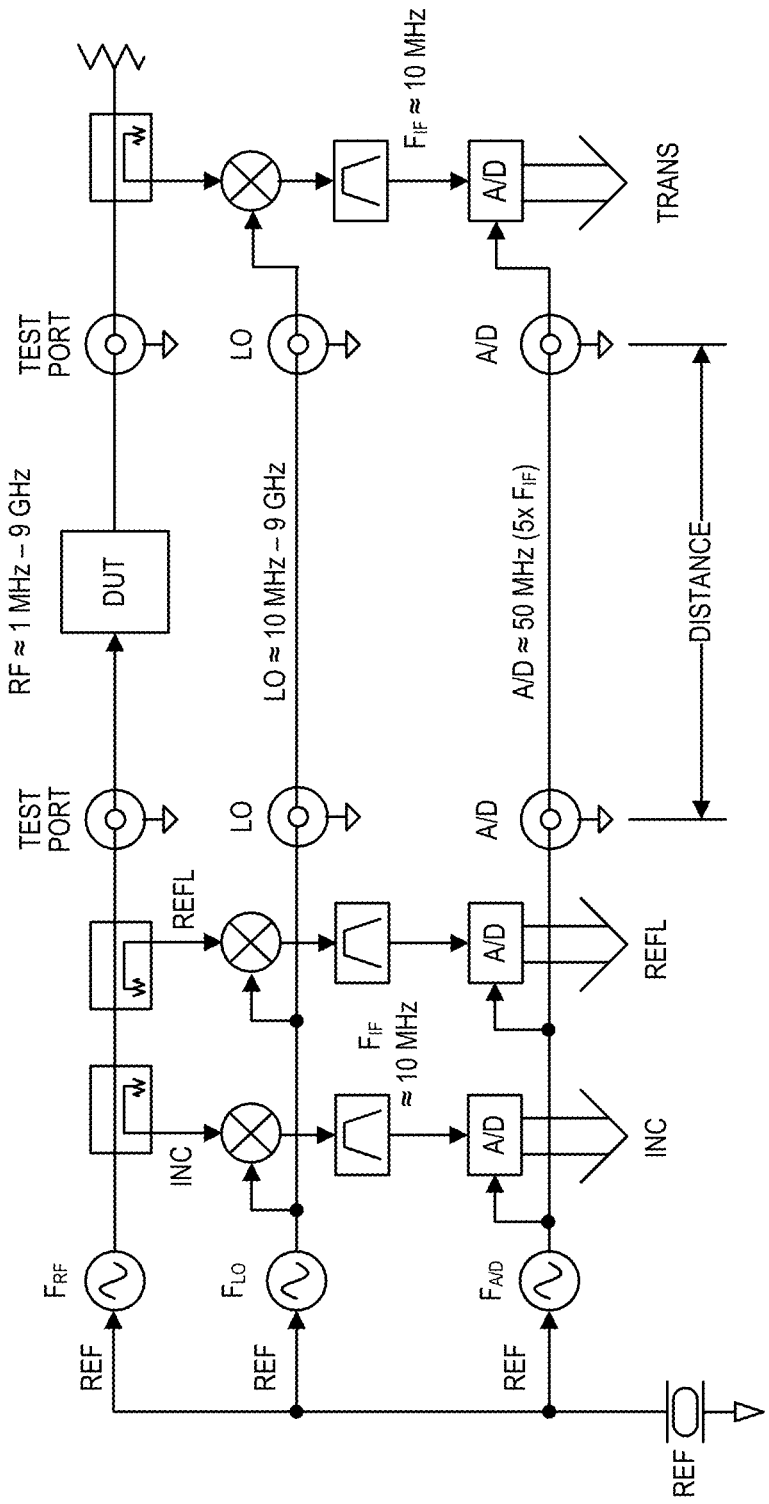
FIG. 1 is a circuit diagram of a measurement instrument and a remote receiver connected through a device under test (DUT) and synchronized, in accordance with the prior art.

Referring to FIG. 1, a vector network analyzer (VNA) is shown connected with a device under test (DUT), which is also connected with a remote receiver to form a two-port network for which scattering (S-) parameters can be measured. A local oscillator (LO) signal and an analog-to-digital (A/D) clock signal are separately generated for use in making S-parameter measurements. The LO signal is used to downconvert radio frequency (RF) signals to intermediate frequency (IF) signals for processing by a receiver. The A/D clock signal is used to sample the downconverted IF signals. Both the LO and A/D clock signals are synchronized to a reference signal (REF) generated by a reference oscillator. An RE source generates test signals for transmission to the DUT and is also synchronized to the reference signal.

As shown, incident power waves (INC) are coupled by the VNA to a mixer for downconversion and then sampled to obtain an "a1" measurement. Likewise, reflected power waves (REEL) are coupled by the VNA to another mixer for downconversion and then sampled to obtain a "b1" measurement. From the a1 and b1 measurements, the magnitude and phase of the forward reflection (S11) parameter can be determined. Transmitted power waves (TRANS) are coupled by the remote receiver to a mixer for downconversion and then sampled to obtain a "b2" measurement. The b2 measurement can be communicated to the VNA via data transmission for use by the VNA in calculating a forward transmission (S21) parameter. The remote receiver is synchronized to the VNA by using LO and A/D clock signals that are synchronized to the LO and A/D clock signals of the VNA. These signals are needed to retain the phase component of the received test signal to the reference signal at the source.

Existing techniques for synchronizing two remote ports of a measurement instrument for measuring electrical response, such as a VNA, can include cabling ports for the LO signal, or multiple LOs if multiple down conversions are used, and the A/D clock signal to ports of a remote receiver. The LO and A/D clock signals of the VNA are transmitted to the remote receiver. The LO signal of the VNA can then be used to downconvert the test signal and the A/D clock signal of the VNA can be used to sample the downconverted test signal. If the phase component is retained, the magnitude and phase of the forward transmission (S21) parameter can be determined from the b2 and a1 measurements. If the phase component is not retained, only the magnitude of the S21 parameter can be determined. If the remote receiver is a VNA, the master/slave roles of the two measurement instruments can be reversed to similarly obtain measurements for the reverse reflection (S22) parameter and the reverse transmission (S12) parameter.

Typically, LO and A/D clock signals are transmitted between a measurement instrument and a remote receiver via coaxial cable. However, practical considerations prevent signals in the microwave region from being extended beyond several meters (in). Phase shifts from the point of transmission at the measurement instrument to the point of reception at the remote receiver are introduced to the LO and A/D clock signals and scale linearly with frequency for a given length. Because of this phase shift, for use cases where the VNA and remote receiver of FIG. 1 must be arranged at some unknown distance greater than some threshold, e.g. further than 20 m for signals having frequencies of 50 MHz or higher, the arrangement of FIG. 1 is not usable for determining the phase of the S21 and S12 parameters unless the phase shift is accounted for.

Measurement instruments, such as the VNA and remote receiver, can be calibrated to account for phase shift by directly connecting the measurement instruments and performing such a calibration and thereafter connecting the measurement instruments through the DUT. However, this may not be practical depending on the use case. Further, the phase shift can be calculated and therefore can be compensated for in phase measurements for the DUT. However, the length and propagation velocity of the transmission medium must be known. If the length of the transmission path is unknown, the phase shift cannot be calculated.

In addition to phase shift, signals transmitted over coaxial cable are attenuated. Coaxial cable signal attenuation increases with both higher frequency and longer transmission length. For example, RG-58 is a type of coaxial cable used for low-power signal and RF connections which attenuates signals at 10.8 decibels (dB) per 100 m at 50 MHz increasing to 70.5 dB per 100 m at 1 GHz. The transmission length can be increased through the use of repeaters or amplifiers, but a further unknown phase component sensitive to environment is thereby introduced.

Embodiments of the present invention relate to transmitter and receiver architectures that use a narrow band, low frequency signal from a RF generator source port provided to a remote receiver port to retain down-converted as well as A/D clocking while retaining absolute phase information over the complete test frequency operational range.

Figure 2:
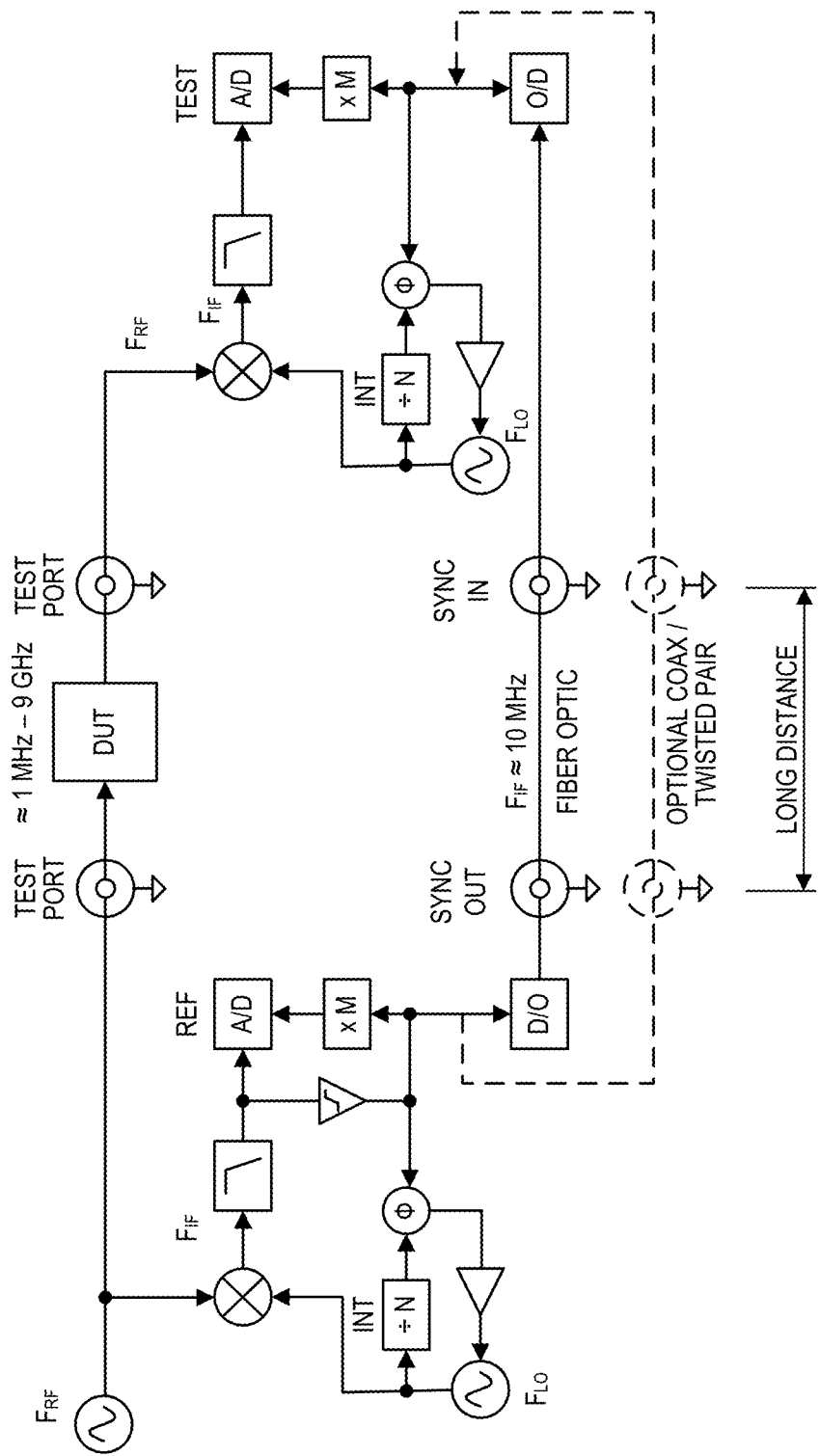
FIG. 2 is a circuit diagram of a measurement instrument and a remote receiver connected through a DUT and synchronized using a single, digital synchronization signal, in accordance with an embodiment.

FIG. 2 is a circuit diagram of a measurement instrument and a remote receiver connected through a DUT and synchronized using a single, low frequency digital signal that is transmitted from the measurement instrument to the remote receiver, in accordance with an embodiment. The length of the coax cable for synchronizing the measurement instrument and the remote receiver of FIG. 1 is limited based at least on the 50 MHz A/D clock signal. The relatively lower frequency (e.g., 10 MHz) synchronization signal generated and transmitted in accordance with an embodiment can travel over a longer transmission path without being unusably attenuated by coaxial cable or twisted pair transmission lines, for example.

As shown, the synchronization signal is the lowest common denominator of the measurement instrument and is generated from the IF signal using a phase-locked loop (PLL) to maintain synchronization between the LO and the A/D clock signal generated by a frequency multiplier. A frequency of 10 MHz is merely exemplary, but is usefully low as a synchronization signal to allow greater lengths of transmission line runs without being so low as to introduce an unreasonable amount of phase noise.

The IF signal generated at a mixer from the LO signal and RF signal is converted to a digital signal by a limiter. The digital signal is provided as input to the PLL and to the frequency multiplier that multiplies the signal for synchronously sampling the IF signal based on the amount of sampling performed for measurements (e.g., M=5 for 50 MHz sampling). The digital signal is also provided as the synchronization signal to the remote receiver. The digital signal is output as the synchronization signal directly from a synchronization output port (SYNC OUT) to the coax cable or twisted pair transmission line.

The remote receiver uses the synchronization signal received at a synchronization input port (SYNC IN) to synchronize a LO signal and an A/D clock signal generated from the synchronization signal by a frequency multiplier. The LO signal is synchronized using a PLL and down converts a received test signal to an IF signal that is then sampled to obtain a transmission measurement. A b2 measurement can be communicated to the VNA from the remote receiver via data transmission along the transmission path of the synchronization signal (i.e., from SYNC IN to SYNC OUT) for use by the VNA, in calculating a forward transmission (S21) parameter.

In a further embodiment, a system and method for synchronizing a measurement instrument and remote receiver can use fiber optic cable for the transmission of the synchronization signal. Attenuation of the signal can be dramatically reduced relative to a coaxial cable or twisted pair transmission line. Attenuation loss can be as low as 0.2 dB/km in optical fiber cables, allowing transmission over long distances without the need for repeaters. In such an embodiment, the synchronization signal is converted from a digital signal to an optical signal and transmitted to the remote receiver whereupon the optical signal is converted back to a digital signal for use in synchronizing the LO and A/D clock signals of the remote receiver. The remote receiver likewise relies on a PLL to synchronize the LO and A/D clock signals.

The synchronization between the measurement instrument and remote receiver will also suffer from phase shift from the point of transmission to the point of reception, but as noted above, the distance between the measurement instrument and remote receiver is less limited due to attenuation relative to the prior art and synchronization can still be achieved through calibration or calculation given a known length of the transmission path.

Figure 3:
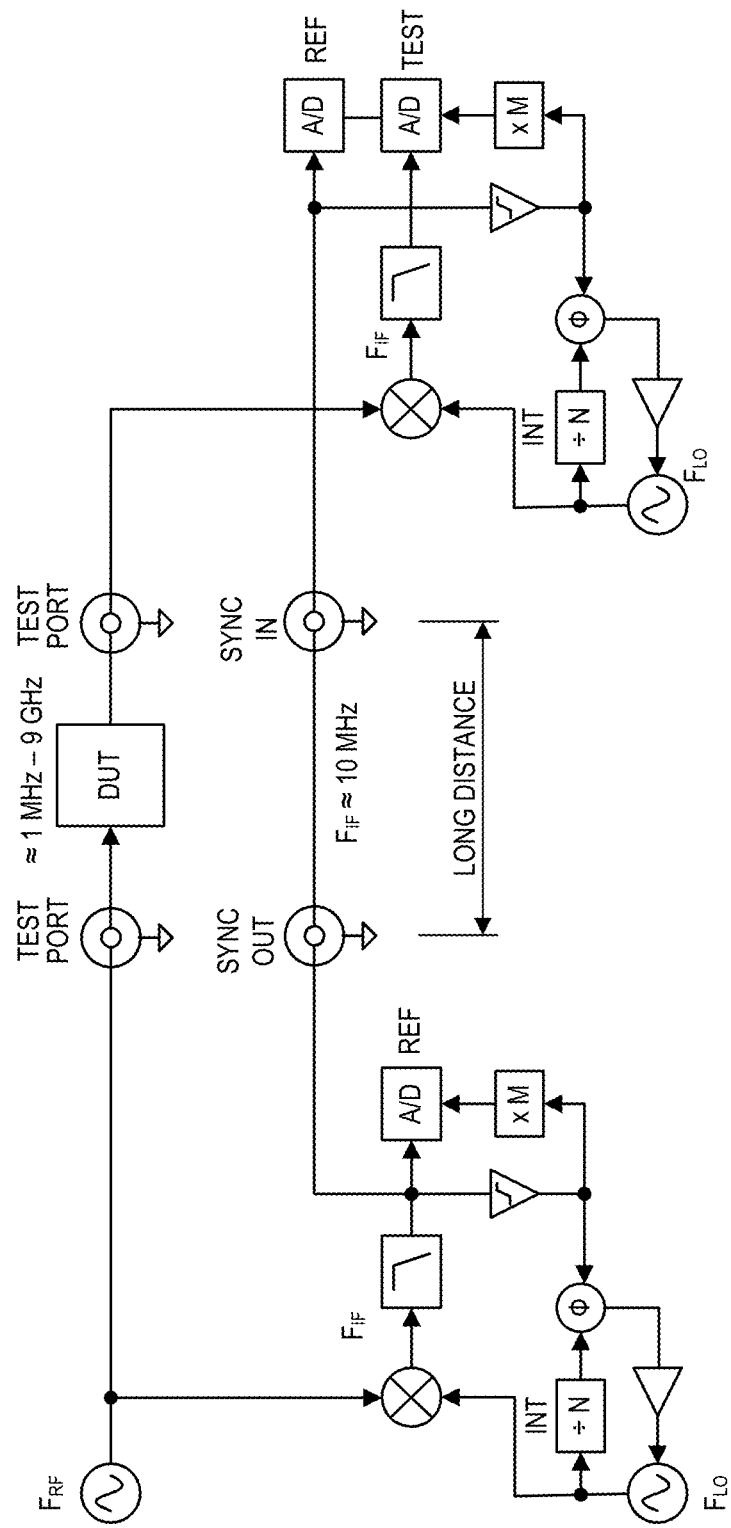
FIG. 3 is a circuit diagram of a measurement instrument and a remote receiver connected through a DUT and synchronized using a single, analog synchronization signal, in accordance with an embodiment.

FIG. 3 is a circuit diagram of a measurement instrument and a remote receiver connected through a DUT and synchronized using a single, low frequency analog signal that is transmitted from the measurement instrument to the remote receiver, in accordance with an embodiment. As with FIG. 2, the relatively lower frequency (e.g., 10 MHz) synchronization signal generated and transmitted in accordance with an embodiment can travel over a longer transmission path without being unusably attenuated by coaxial cable or twisted pair transmission lines, for example. However, unlike FIG. 2 the measurement instrument transmits an analog signal rather than a digital signal.

As shown, the synchronization signal is the lowest common denominator of the measurement instrument and is generated from the IF signal using a PLL to maintain synchronization between the LO and the A/D clock signal generated by a frequency multiplier. A frequency of 10 MHz is merely exemplary, but is usefully low as a synchronization signal to allow greater lengths of transmission line runs without being so low as to introduce an unreasonable amount of phase noise.

The IF signal generated at a mixer from the LO signal and RF signal is converted to a digital signal by a limiter. The digital signal is provided as input to the PLL and to the frequency multiplier that multiplies the signal for synchronously sampling the IF signal based on the amount of sampling performed for measurements (e.g., M=5 for 50 MHz sampling). The IF signal is also provided as the synchronization signal to the remote receiver. The IF signal is output as the synchronization signal directly from a synchronization output port to the coax cable or twisted pair transmission line.

The remote receiver uses the synchronization signal received at a synchronization input port (SYNC IN) to synchronize a LO signal and an A/D clock signal. The synchronization signal is digitized and then provided to a PLL and a frequency multiplier. The LO signal is synchronized using the PLL and down converts a received test signal to an IF signal that is then sampled to obtain a transmission measurement. The synchronization signal is further provided to an A/D to generate a reference signal. A test signal and the reference signal can be ratioed to obtain a forward transmission (S21) measurement at the remote receiver.

As above, in a further embodiment a system and method for synchronizing a measurement instrument and remote receiver can use fiber optic cable for the transmission of the synchronization signal. In such an embodiment, the synchronization signal is converted from an analog signal to an optical signal and transmitted to the remote receiver whereupon the optical signal is converted back to an analog signal for use in synchronizing the LO and A/D clock signal of the remote receiver. The remote receiver likewise relies on a PLL to synchronize the LO and A/D clock, but generates a digital signal from the analog synchronization signal.

Figure 4:
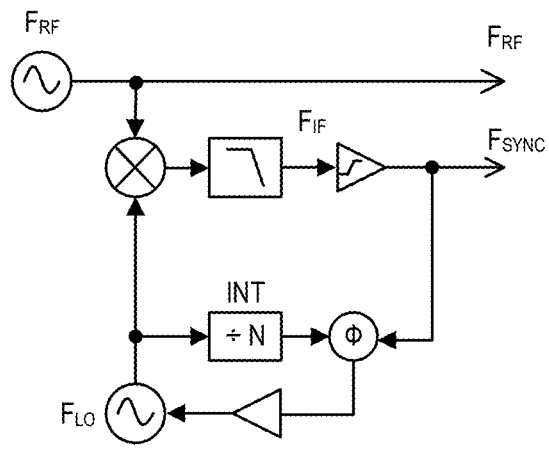
FIG. 4 is a circuit diagram of a locking loop for locking a local oscillator (LO) signal to a digital synchronization signal, in accordance with an embodiment.

FIG. 4 is a circuit diagram of the PLL used in FIGS. 2 and 3 for phase-locking a LO signal to an RF signal, and to a digital synchronization signal, in accordance with an embodiment. The circuit is isolated to highlight the generation of the synchronization signal. As shown, the LO has a frequency $F_{LO}$ greater than the frequency $F_{RF}$ of the RF signal, and an IF signal having frequency $F_{IF}$ generated by a mixer as the difference in frequency of the LO and RF signals ($F_{IF}=F_{LO}-F_{RF}$). A digital synchronization signal is generated from the IF signal by a limiter and has a frequency $F_{SYNC}$ equal to the frequency of the IF signal ($F_{IF}=F_{LO}$). The synchronization signal is provided to the PLL and becomes a reference for the LO and the PLL drives the frequency of the LO until the frequency divided by some integer (N) matches the synchronization frequency (i.e., $F_{LO}=N\times F_{SYNC}$). The LO is thus locking to its output to track the phase of the RF signal. FIG. 4 further includes expressions and formulae indicating that N program ($N_p$) must be an integer, and once determined, $F_{IF}$ and $F_{LO}$ can be determined exactly.

In the embodiments shown in FIGS. 2-8, the target frequency of the IF and synchronization signals is 10 MHz; however; in other embodiments some other target frequency can be used. The frequencies, integers, sampling rates, and other values used herein are merely exemplary, but represent possible design choices.

Figure 5:
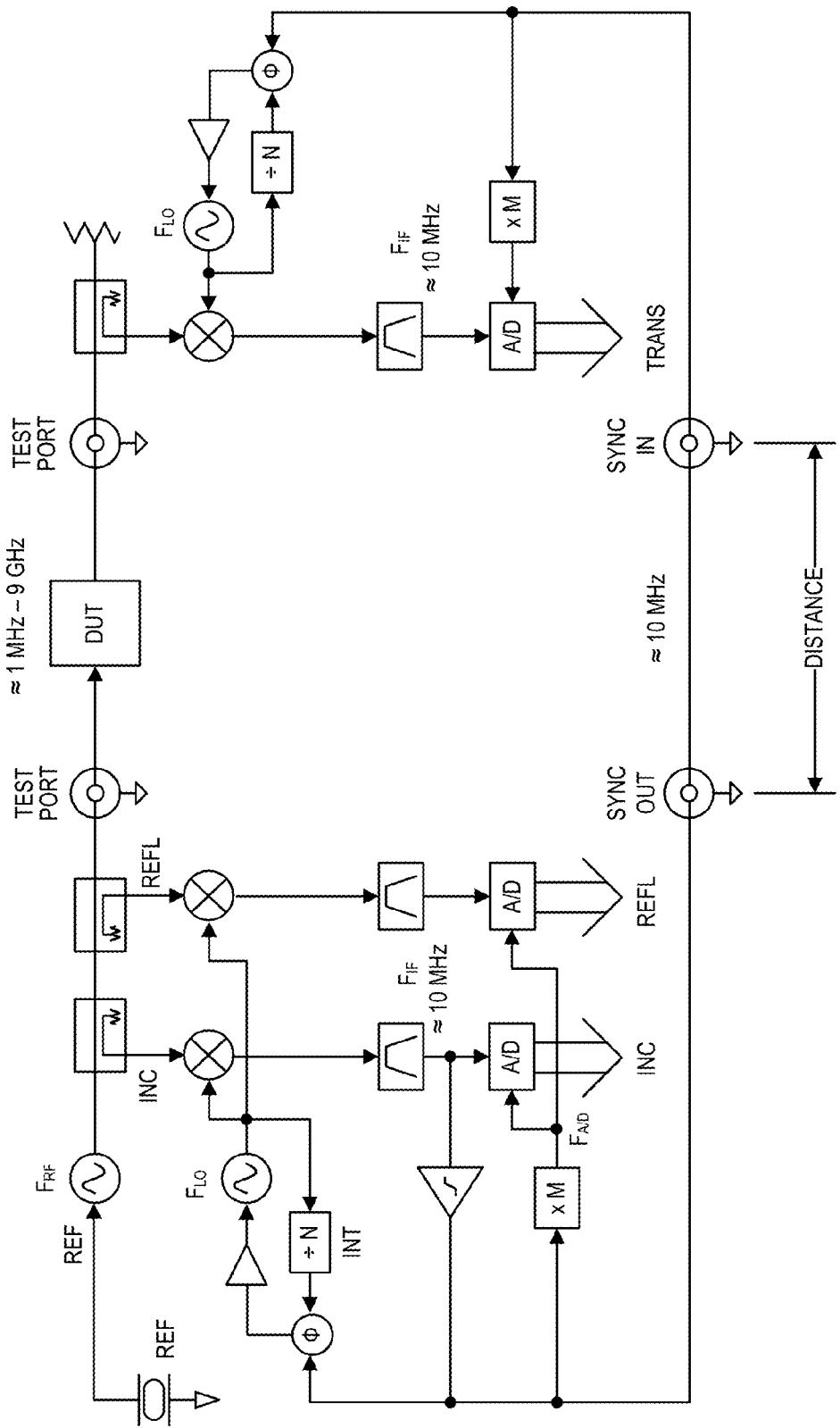
FIG. 5 is a circuit diagram of a network analyzer and a remote receiver connected through a DUT and synchronized using a single, digital synchronization signal, in accordance with an embodiment.

FIG. 5 is a circuit diagram of a VNA and a remote receiver connected through a DUT and synchronized using a single, low frequency digital signal that is transmitted from the measurement instrument to the remote receiver, in accordance with an embodiment. The VNA and remote receiver forms a two-port network for measuring S-parameters. A LO signal and an A/D clock signal are phase-locked by a PLL as shown in FIG. 4 and described above for use in making S-parameter measurements. The LO signal and the A/D clock signal are synchronized by IF signals from which a digital synchronization signal is generated by a limiter. The LO signal is used to downconvert incident (INC) and reflected (REFL) RF signals to IF signals for measuring S-parameters. The A/D clock signal is used to sample the downconverted IF signals. Both the LO and A/D clock signals are synchronized to a reference signal (REF) generated by a reference oscillator. An RF source generates test signals for transmission to the DUT and is also synchronized to the reference signal.

As shown, incident power waves (INC) are coupled by the VNA to a mixer for downconversion and then sampled to obtain an "a1" measurement. Likewise, reflected power waves (REFL) are coupled by the VNA to another mixer for downconversion and then sampled to obtain a "b1" measurement. From the a1 and b1 measurements, the magnitude and phase of the forward reflection (S11) parameter can be determined. Transmitted power waves (TRANS) are coupled by the remote receiver to a mixer for downconversion and then sampled to obtain a "b2" measurement. The b2 measurement can be communicated to the VNA via data transmission for use by the VNA in calculating a forward transmission (S21) parameter. The remote receiver is synchronized to the VNA by the synchronization signal received by the remote receiver to phase-lock the LO and A/D clock signals of the remote receiver via a PLL. These signals retain the phase component of the received test signal to the reference signal at the source.

Figure 6:
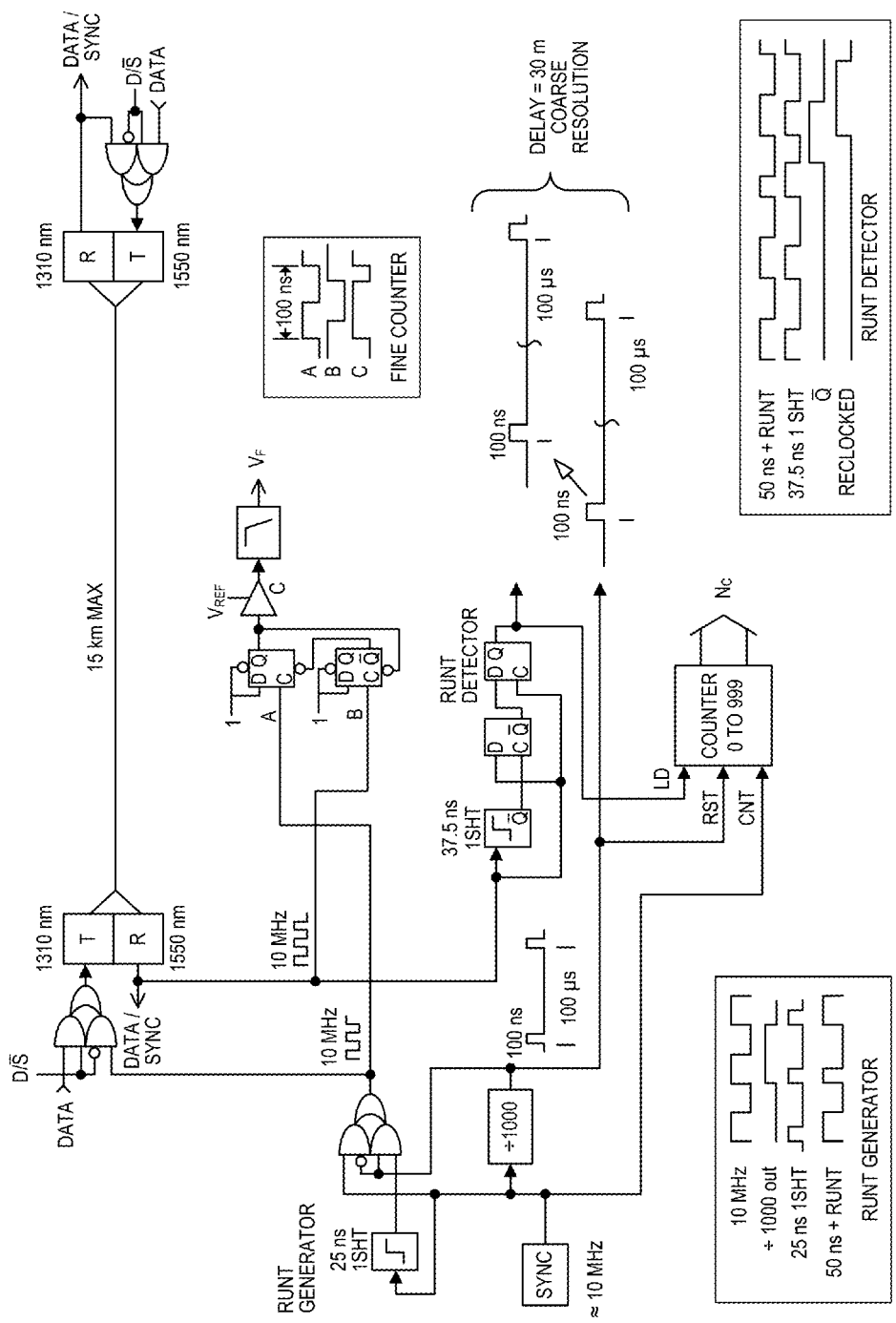
FIG. 6 is a circuit diagram of a measurement instrument providing a synchronization signal to a remote receiver through a connection including a duplexer, the circuit diagram being configured to measure a length of the connection, in accordance with an embodiment.

FIG. 6 is a circuit diagram of a measurement instrument and a remote receiver wherein a length of a transmission path of a synchronization signal can be determined by the measurement instrument, in accordance with an embodiment. A synchronization signal is transmitted by the measurement instrument to the remote receiver using a single length of fiber optic cable. The fiber optic cable is connected at the measurement instrument and the remote receiver by a duplexer that transmits and receives the synchronization signal at different wavelengths (e.g., 1310 nm and 1550 nm) so that the measurement instrument can transmit and receive signals at the same time.

The measurement instrument comprises a coarse counter and a fine counter for determining the length of the transmission path based on detection of a runt inserted into a synchronization signal transmitted from the measurement instrument to the remote receiver and retransmitted from the remote receiver back to the measurement instrument. The coarse counter includes a divider that divides the frequency of the synchronization signal to synchronize the coarse counter with the synchronization signal and provide a reset signal (RST) that spans a number of cycles of the synchronization signal corresponding to the integer number of the division.

As shown, the coarse counter includes a divider that divides the frequency of the synchronization signal by 1000 to generate a signal used as a coarse counter reset over a wavelength of 100 microsecond (μs) with an integer number of cycles of the synchronization signal transmitting over the wavelength being 1000. This provides a coarse counter ranging from 0 to 999 cycles. Over a fiber optic cable a maximum length of approximately 15 kilometers (km) is traversed in both directions over a count of 1000 cycles (c*100 μs≈30 km), assuming a propagation velocity approximating 100%.

Referring again to FIG. 6, as shown the synchronization signal of 10 MHz can be used to create pulses of 50 ns in length. The coarse counter includes a runt generator that inserts a runt pulse of 25 ns in length into the synchronization signal. The synchronization signal with the runt is transmitted to the remote receiver, which retransmits the synchronization signal back to the transmitter. A runt detector detects the runt and sends a signal to the counter to mark the count. If the runt is generated when the count is reset, the count will indicate the number of cycles that have passed before detection of the runt from which the length of the transmission line and the number of cycles of phase ($N_c$) is determined. The coarse counter is reset by a signal (RST) from the divider.

The runt detector comprises a runt generator that produces a runt of 37.5 ns in length for each pulse detected in the synchronization signal received at the measurement instrument and provides the runt to a pair of D flip flops. As shown in the signal box for the runt detector, when the value D of the first flip-flop is below the value of the 37.5 ns runt, the flip-flop outputs a Q of 1, which sends a load (LD) signal to the coarse counter indicating the detection of the runt. The coarse distance measurement ($DIST_c$) and the coarse phase measurement ($\Phi_c$) can be calculated using the formulas:

$$DIST_c = 15\ m * Nc$$

$$\Phi_c = 360 * Nc$$

The coarse loop has a 30 m delay resolution based on the period of the synchronization signal of 100 ns. The fine loop allows the measurement instrument to resolve the resolution to provide accurate distance by interpreting between the period of the synchronization signal. The fine loop comprises a phase-to-voltage converter including a pair of D flip flops. The first flip-flop receives the transmitted synchronization signal (A) and a signal from the second flip-flop and outputs a voltage. The second flip-flop receives the received synchronization signal (B) and outputs a value to the first flip-flop. The output of the flip-flops (C) is a voltage ($V_F$) that, when ratioed over a reference voltage ($V_{REF}$) of a phase detector provides a percentage of the cycle synchronization signal. The fine distance measurement ($DIST_F$) can then be calculated based on the length of the period dividing in half for the two-way trip and multiplied by the ratio of voltages. The fine distance measurement ($DIST_F$) and the coarse phase measurement ($\Phi_F$) can be calculated using the formulas:

$$DIST_F = 15\ m*(V_F/V_{REF})$$

$$\varepsilon_F = 360*(V_F/V_{REF})$$

The total distance and total phase are therefore calculated using the formulas:

$$DIST = 15\ m(Nc + (V_F/V_{REF}))$$

$$\Phi = 360(Nc + (V_F/V_{REF}))$$

Figure 7:
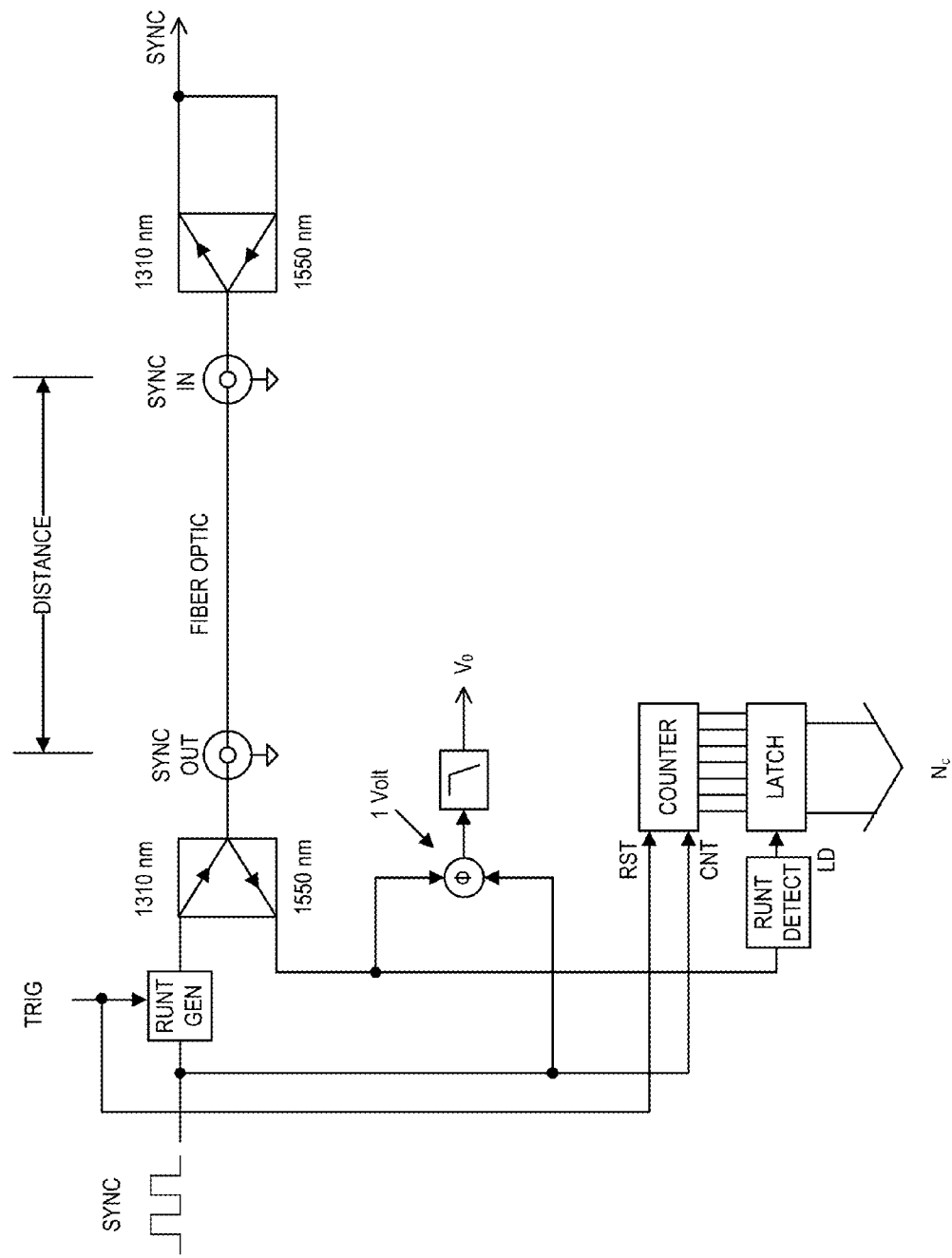
FIG. 7 is a circuit diagram of an implementation of a portion of the circuit diagram of FIG. 6, in accordance with an embodiment.

FIG. 7 is a circuit diagram illustrating an implementation of the measurement instrument of FIG. 6, in accordance with an embodiment. The counter can comprise, for example, a series of flip flops sampling the counter's value. A saw-tooth voltage steps higher and higher until the runt detector sends a signal to a latch. The circuit also uses a phase detector to output a voltage ($V_o$) from which a portion of the period of the synchronization signal is determined.

Figure 8:
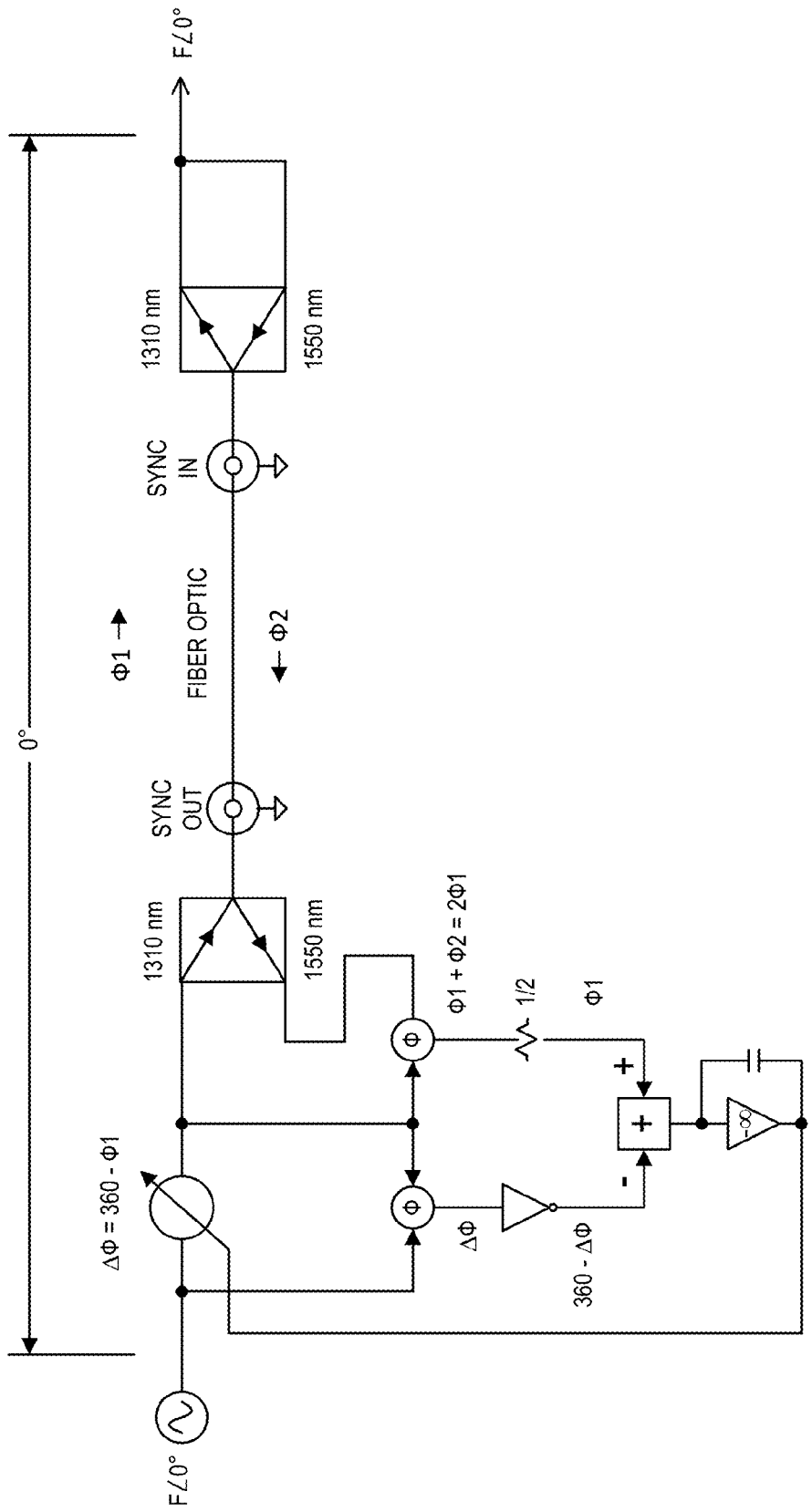
FIG. 8 is a circuit diagram of a measurement instrument configured to synchronize a phase of a signal received at a remote receiver with a phase of a signal transmitted from the measurement instrument through a connection including a duplexer, in accordance with an embodiment.

FIG. 8 is a circuit diagram of a measurement instrument and a remote receiver connected through a DUT and phase-locked to match positive edges of a synchronization signal at the output of the measurement instrument and at the input of the remote receiver, in accordance with an embodiment. The phase of a transmitted signal down a fiber optic link to a remote receiver is adjusted by returning the transmitted signal to the point of origin. The phase adjustment at the transmitting point is set to one half the phase difference between the transmitted and received phase. This causes the remote phase to be exactly the same as the transmitted phase. The phase adjustment is done in a closed loop process in real time. The loop settling time is approximately 3 times the total transit time of the transmitted to receive time duration. For a 15 km fiber length the settling time is approximately 450 µs.

The loop of the measurement instrument comprises a voltage controlled phase shifter (VCPS) to match the phase of the synchronization signal (F angle 0) output by the measurement instrument to the phase of the synchronization signal input of the remote receiver. A phase-to-voltage converter drives the VCPS. The synchronization signal before and through the VCPS are provided as inputs to a first phase detector and the synchronization signal through the VCPS and the synchronization signal retransmitted by the receiver are provided as input to a second phase detector. The output of the first phase detector is inverted and the output of the second phase detector is halved to account for the two-way transmission, and both outputs are then provided to a comparator. The output of the comparator drives the VCPS, forcing the pulse edges of the synchronization signal to be aligned at the measurement instrument and the remote receiver.

Figure 9:
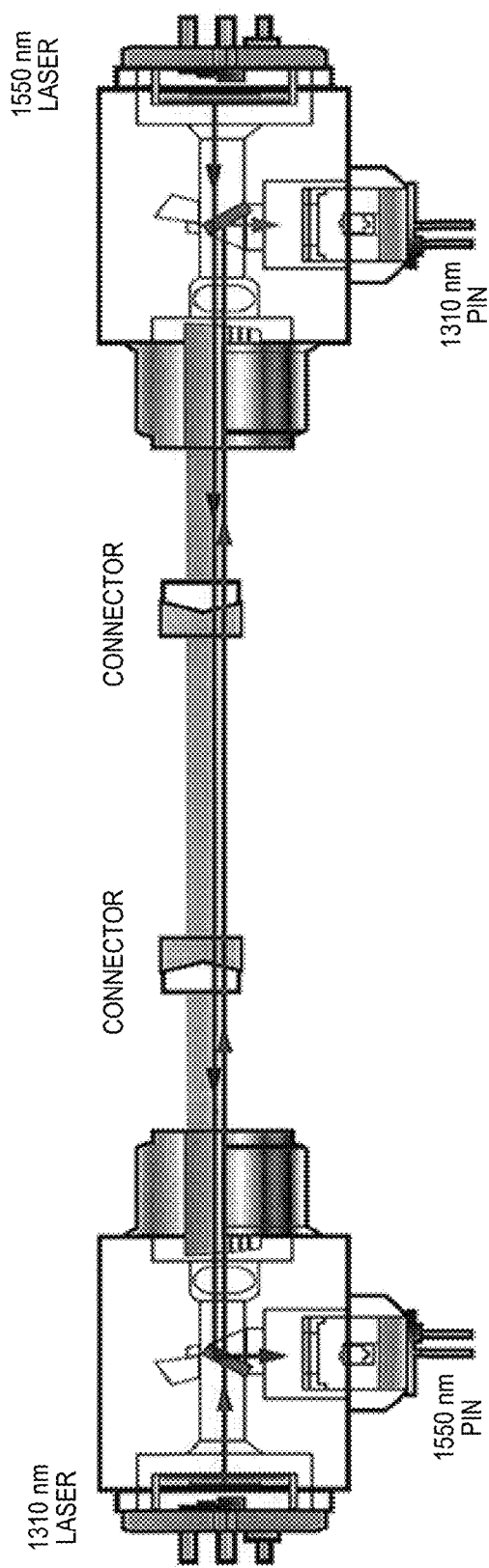
FIG. 9 illustrates a duplexer for both transmitting and receiving signals along a fiber optic cable for use with embodiments of the present invention.

FIG. 9 illustrates an exemplary single fiber, two wavelength integrated optical transceiver for use with embodiments of the present invention. The optical transceiver relies on optical signals having two wavelengths traveling in opposite directions. Wavelength division multiplexer (WDM) couplers integrated into the transceiver combine or separate the two wavelengths at the edges.

Figure 10:
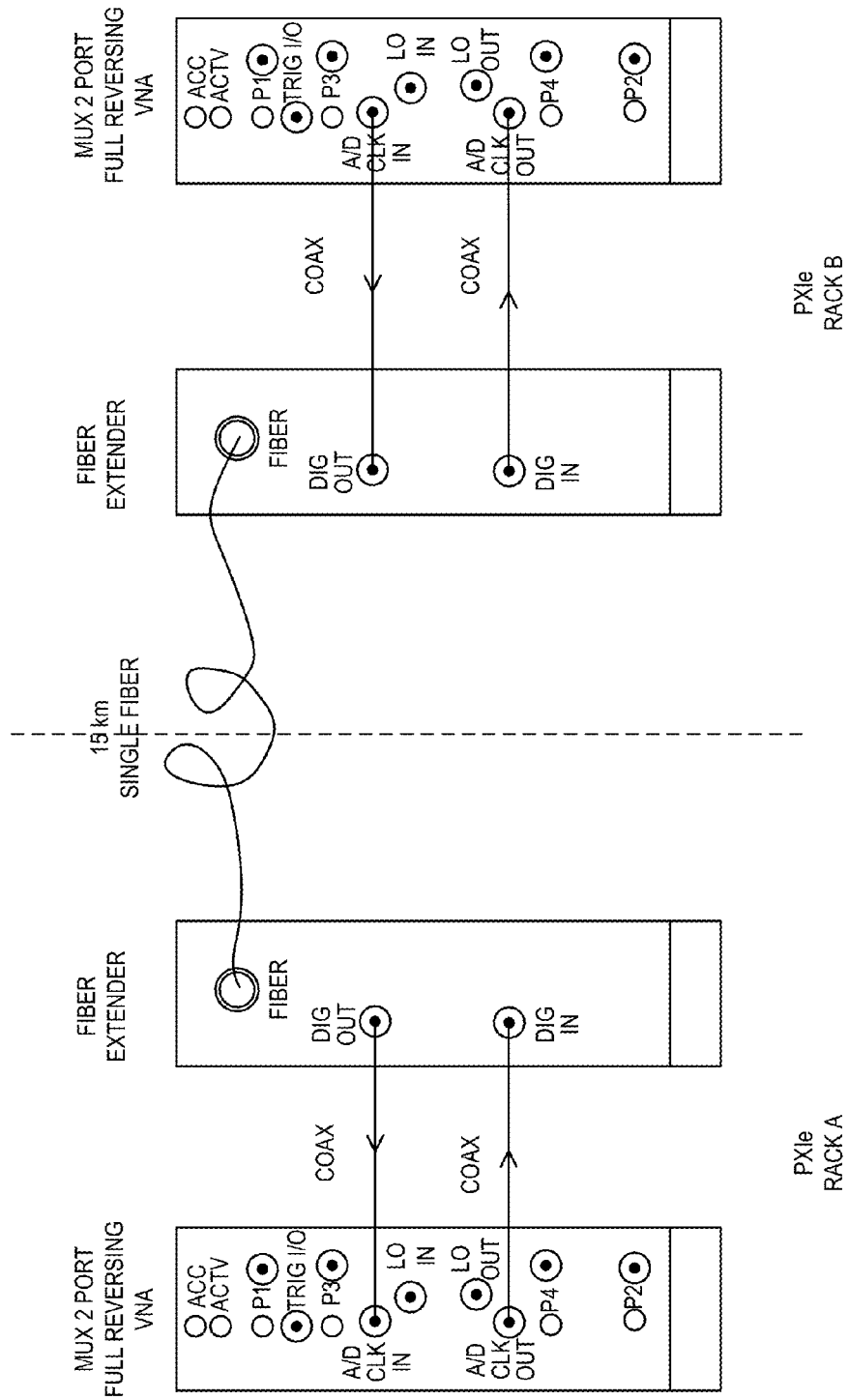
FIG. 10 illustrates a pair of vector network analyzers (VNAs) synchronized by a fiber optic cable, in accordance with an embodiment.
Figure 11:
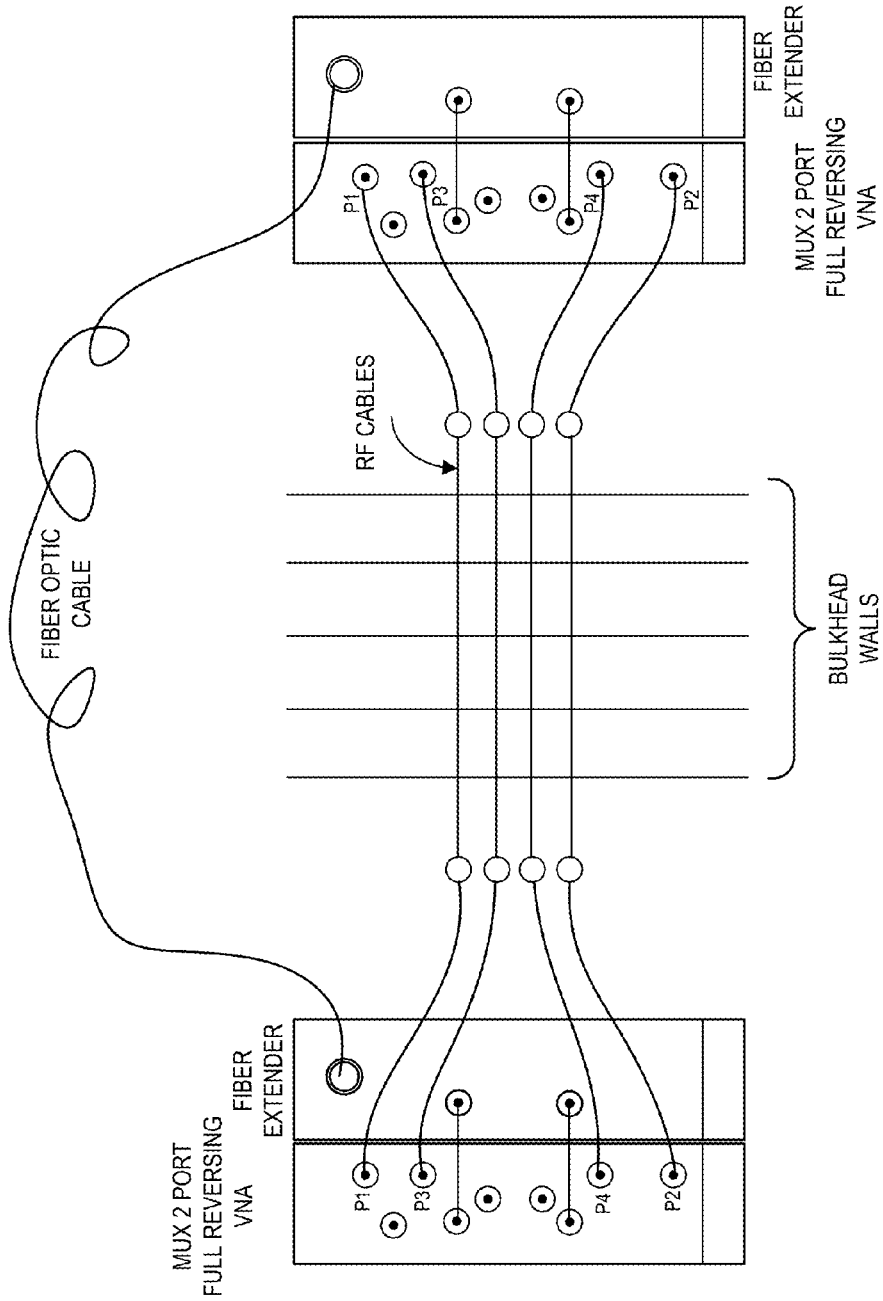
FIG. 11 illustrates a pair of VNAs synchronized by a fiber optic cable and connected at test ports to cables extending through bulkhead walls of a ship, in accordance with an embodiment.
Figure 12:
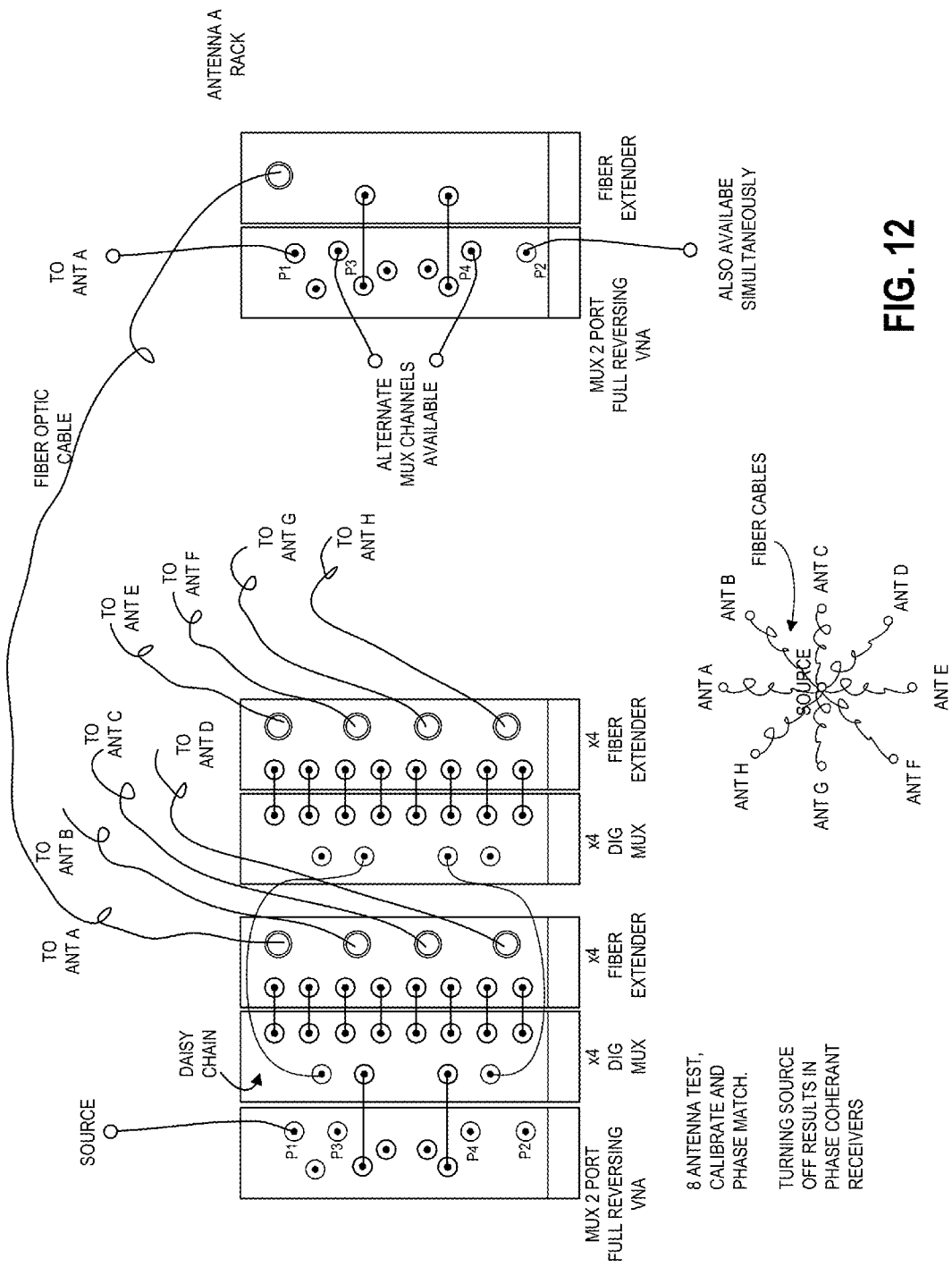
FIG. 12 illustrates a pair of VNAs synchronized by a fiber optic cable connected by way of fiber extenders multiplexed to DUTs comprising a plurality of antennas acting as DUTs, in accordance with an embodiment.

FIGS. 10-12 illustrate use cases for measurement instruments for and methods of obtaining phase measurements, in accordance with embodiments of the present invention. FIG. 10 illustrates a pair of commercially available VNAs separated by some distance. The coax can be daisy chained at either end for more ports. The A/D clock signals of the first VNA are connected via coaxial cable with a fiber extender (e.g., an SDR PCIx host card) and transmitted to a fiber extender connected with the second VNA.

FIG. 11 illustrates a use case of a ship. Typically, a ship uses cables fed through bulkheads of the ship, for example to connect a transmission room with an antenna at opposite ends of the ship. Performance of the cables can be measured end-to-end by running fiber optic cable between a transmitting measurement instrument and a receiver. For example, the fiber optic cable can be connected across flight decks, down hatches, etc. The characteristics of the cables through the ship can be measured, including characteristics related to phase.

FIG. 12 illustrates a uses case of an antenna array. For example, given one antenna common to and distant from an array of eight antennas, a technician may want to measure the transmission between the one distant, common one antenna and the eight antennas that are separated by different distances to determine any problems with the antenna paths. The antennas will all receive the same signal swept from the lowest end to the highest end of the bandwidth of the attached antenna to determine whether the measured characteristics are the same. Because the source is one, common antenna, if the characteristics of one antenna differs, the result could be an indication of a bad connection or loose cable, for example.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A measurement instrument for measuring electrical characteristics of a device under test (DUT), comprising:
   a synchronization signal generator connectable with a receiver via a fiber optic cable and a duplexer configured to transmit a synchronization signal from the measurement instrument to the receiver and retransmit the received synchronization signal from the receiver to the measurement instrument;
   a coarse phase detection counter including a runt generator for inserting a runt pulse into the synchronization signal and a runt detector for counting a number of cycles of the synchronization signal transmitted from the measurement instrument until the runt pulse is detected in the retransmitted synchronization signal received at the measurement instrument; and
   a fine phase detection counter including a phase-to-voltage converter for determining a fraction of a period of the retransmitted synchronization signal received at the measurement instrument;
   wherein the coarse phase detection counter and the fine phase detection counter are configured to determine one or both of a distance from the receiver to the measurement instrument and a phase shift in the synchronization signal between the receiver and the measurement instrument.

2. The measurement instrument of claim 1, wherein the coarse phase detection counter includes
   a counter that maintains a count based on the synchronization signal, and
   a frequency divider to generate a reset signal for the counter from the synchronization signal.

3. The measurement instrument of claim 2, wherein the run generator is a first runt generator, and
   wherein the runt detector includes a second runt generator for generating a runt having a length between the length of a pulse of the synchronization signal and the length of a runt generated by the first runt generator; and
   wherein the runt generated by the second runt generator is provided as input to a pair of D flip flops to output a signal to the counter in response to the runt from the first runt generator in the retransmitted synchronization signal received at the measurement instrument.

4. The measurement instrument of claim 3, wherein the counter is a series of flip flops that progressively build a sawtooth signal and wherein the counter includes a latch to stop the count of the counter and the build of the sawtooth signal.

5. A system for measuring electrical characteristics of a device under test (DUT), comprising:
   a measurement instrument adapted to be connected with the DUT for transmitting tests signals to the DUT, the measurement instrument comprising a synchronization signal generator, a coarse phase detection counter and a fine phase detection counter;
   a receiver adapted to be connected with the DUT and arranged remote from the measurement instrument to receive the test signals transmitted by the measurement instrument to the DUT;
   a duplexer configured to transmit a synchronization signal from the measurement instrument to the receiver via fiber optic cable and retransmit the received synchronization signal from the receiver to the measurement instrument;
   wherein the coarse phase detection counter and the fine phase detection counter are configured to determine one or both of a distance from the receiver to the measurement instrument and a phase shift in the synchronization signal between the receiver and the measurement instrument;
   wherein the coarse phase detection counter includes a runt generator for inserting a runt pulse into the synchronization signal and a runt detector for counting a number of cycles of the synchronization signal transmitted from the measurement instrument until the runt pulse is detected in the retransmitted synchronization signal received at the measurement instrument; and
   wherein the fine phase detection counter includes a phase-to-voltage converter for determining a fraction of a period of the retransmitted synchronization signal received at the measurement instrument.

6. The system of claim 5, wherein the coarse phase detection counter includes
   a counter that maintains a count based on the synchronization signal, and
   a frequency divider to generate a reset signal for the counter from the synchronization signal.

7. The system of claim 6, wherein the run generator is a first runt generator, and
   wherein the runt detector includes a second runt generator for generating a runt having a length between the length of a pulse of the synchronization signal and the length of a runt generated by the first runt generator; and
   wherein the runt generated by the second runt generator is provided as input to a pair of D flip flops to output a signal to the counter in response to the runt from the first runt generator in the retransmitted synchronization signal received at the measurement instrument.

8. The system of claim 7, wherein the counter is a series of flip flops that progressively build a sawtooth signal and wherein the counter includes a latch to stop the count of the counter and the build of the sawtooth signal.

9. A method for measuring electrical characteristics of a device under test (DUT) based on transmitted test signals, comprising:
   using a measurement instrument comprising a synchronization signal generator, a coarse phase detection counter and a fine phase detection counter;
   using a receiver;
   wherein the coarse phase detection counter and the fine phase detection counter are configured to determine one or both of a distance from the receiver to the measurement instrument and a phase shift in the synchronization signal between the receiver and the measurement instrument;
   wherein the coarse phase detection counter includes a runt generator for inserting a runt pulse into the synchronization signal and a runt detector for counting a number of cycles of the synchronization signal transmitted from the measurement instrument until the runt pulse is detected in the retransmitted synchronization signal received at the measurement instrument; and
   wherein the fine phase detection counter includes a phase-to-voltage converter for determining a fraction of a period of the retransmitted synchronization signal received at the measurement instrument;
   connecting a test port of the measurement instrument to the DUT;
   connecting a test port of the receiver to the DUT such that the receiver receives test signals transmitted by the measurement instrument and through the DUT;
   connecting a synchronization port of the measurement instrument to a synchronization port of the receiver via a fiber optic cable and a duplexer such that the receiver receives the synchronization signal; and measuring a distance of the measuring instrument to the receiver based on the synchronization signal and the coarse phase detection counter and the fine phase detection counter;

measuring electrical characteristics of the DUT based on the transmitted test signals.

* * * * *